(12) United States Patent
Sharrock et al.

(10) Patent No.: US 9,812,343 B2
(45) Date of Patent: Nov. 7, 2017

(54) LOAD STATION

(75) Inventors: Leigh F. Sharrock, Londonderry, NH (US); Tsepa Bayul, Somerville, MA (US); Christopher J. Dancewicz, Methuen, MA (US); Wayne A. Lasante, Littleton, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 528 days.

(21) Appl. No.: 14/344,930

(22) PCT Filed: Sep. 14, 2012

(86) PCT No.: PCT/US2012/055374
§ 371 (c)(1),
(2), (4) Date: Jul. 10, 2014

(87) PCT Pub. No.: WO2013/040330
PCT Pub. Date: Mar. 21, 2013

(65) Prior Publication Data
US 2015/0249029 A1    Sep. 3, 2015

Related U.S. Application Data

(60) Provisional application No. 61/534,681, filed on Sep. 14, 2011.

(51) Int. Cl.
*H01L 21/677* (2006.01)
*H01L 21/67* (2006.01)

(52) U.S. Cl.
CPC .... *H01L 21/67706* (2013.01); *H01L 21/6773* (2013.01); *H01L 21/67173* (2013.01);
(Continued)

(58) Field of Classification Search
CPC .................. H01L 21/67775; H01L 21/67778
(Continued)

(56) References Cited

U.S. PATENT DOCUMENTS 6,364,762 B1    4/2002 Kaveh et al.
6,648,974 B1   11/2003 Ogliari et al.
(Continued)

FOREIGN PATENT DOCUMENTS

CN    1334952    2/2002
CN    1525529    9/2004
(Continued)

OTHER PUBLICATIONS

International Search Report, Application No. PCT/US2012/055374, dated Dec. 6, 2012.

*Primary Examiner* — Jonathan Snelting
(74) *Attorney, Agent, or Firm* — Perman & Green, LLP; Colin C. Durham (57) ABSTRACT

A substrate loading station including a frame forming a chamber configured to hold a controlled environment, a transfer robot connected to the frame and one or more substrate cassette holding locations each capable of having a substrate cassette holder disposed within the frame. Each of the one or more substrate cassette holding locations being configured to removably support a respective substrate cassette in a predetermined position for communication with the transfer robot to effect substrate transfer between a respective cassette and the transfer robot where the one or more substrate cassette holding locations are configured to effect the interchangeability of one or more substrate cassette holders with other substrate cassette holders for changing a substrate cassette holding capacity of the substrate loading station.

20 Claims, 8 Drawing Sheets (52) U.S. Cl.
 CPC .. *H01L 21/67276* (2013.01); *H01L 21/67766* (2013.01); *H01L 21/67769* (2013.01); *H01L 21/67778* (2013.01)

(58) Field of Classification Search
 USPC .......................................................... 414/937
 See application file for complete search history.

(56) References Cited

U.S. PATENT DOCUMENTS

| | | | |
|---|---|---|---|
| 7,896,602 B2* | 3/2011 | Rebstock | H01L 21/67769 414/217 |
| 2001/0014266 A1 | 8/2001 | Toshima et al. | |
| 2001/0043849 A1 | 11/2001 | Perlov et al. | |
| 2004/0258505 A1* | 12/2004 | Wu | H01L 21/67775 414/217.1 |
| 2006/0104750 A1 | 5/2006 | Lee et al. | |
| 2008/0206021 A1 | 8/2008 | Smith et al. | |
| 2009/0016855 A1 | 1/2009 | Hofmeister et al. | |
| 2012/0067770 A1* | 3/2012 | Hatano | H01L 21/67775 206/710 |
| 2014/0308108 A1* | 10/2014 | Fosnight | H01L 21/67775 414/800 |
| 2016/0064258 A1* | 3/2016 | Larisch | H01L 21/67379 414/293 |

FOREIGN PATENT DOCUMENTS

| | | |
|---|---|---|
| JP | 07010213 | 1/1995 |
| JP | 2003510837 | 3/2003 |
| JP | 2005166842 | 6/2005 |
| JP | 2006332326 | 12/2006 |

* cited by examiner

FIG.4A DOORS CLOSED

FIG.4B DOORS OPEN

FIG.4C DOORS CLOSED

FIG.4D DOORS OPEN

FIG.5

LOAD STATION

CROSS-REFERENCE TO RELATED APPLICATIONS

This application is the National Stage of International Application No. PCT/US2012/055374 having International Filing date, 14 Sep. 2012, which designated the United States of America, and which International Application was published under PCT Article 21 (s) as WO Publication 2013/040330 A1 and which claims priority from, and benefit of U.S. Provisional Application No. 61/534,681 filed on 14 Sep. 2011, the disclosures of which are incorporated herein by reference in their entireties.

BACKGROUND

1. Field

The aspects of the disclosed embodiment generally relate to semiconductor processing equipment and, more particularly, to the loading and unloading of the semiconductor processing equipment.

2. Brief Description of Related Developments

In some instances semiconductor processing times are very long, sometimes hours. To allow the semiconductor processing equipment to operate uninterrupted for these long processing times multiple cassettes of substrates are provided. Generally, conventional semiconductor processing equipment accommodates equipment front end modules (EFEMs) where up to four cassettes are placed on load ports located linearly in a row. These linearly arranged cassettes are accessed by a transfer robot that generally travels along a linear guide track to allow the transfer robot to access each cassette. This EFEM configuration may be insufficient to meet the needs of semiconductor manufacturers that are manufacturing semiconductor products with the very long processing times such that the manufacture of the semiconductor products is cost effective.

It would be advantageous to provide a loading and unloading station for semiconductor processing equipment that can supply a sufficient number of cassettes to the semiconductor processing equipment so that the manufacture of the semiconductor products is performed in a cost effective manner.

BRIEF DESCRIPTION OF THE DRAWINGS

The foregoing aspects and other features of the disclosed embodiments are explained in the following description, taken in connection with the accompanying drawings, wherein.

DETAILED DESCRIPTION

FIGS. 1A-1D illustrate schematic views of substrate processing apparatus or tools incorporating aspects of the disclosed embodiment as disclosed further herein. Although aspects of the disclosed embodiment will be described with reference to the drawings, it should be understood that the aspects of the disclosed embodiment can have many alternate forms. In addition, any suitable size, shape or type of elements or materials could be used.

Figure 1A:
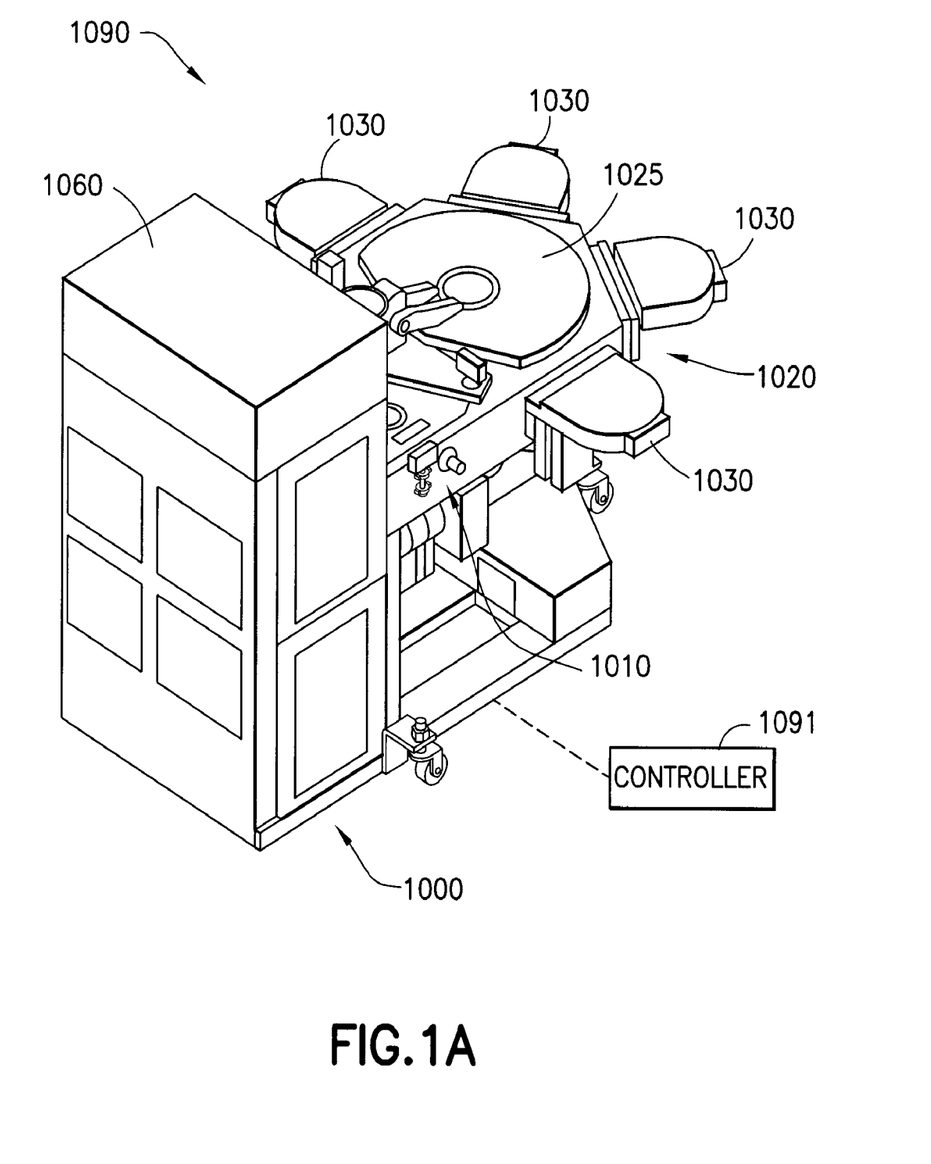
FIGS. 1A-1D are schematic views of processing tools in accordance with aspects of the disclosed embodiment.
Figure 1B:
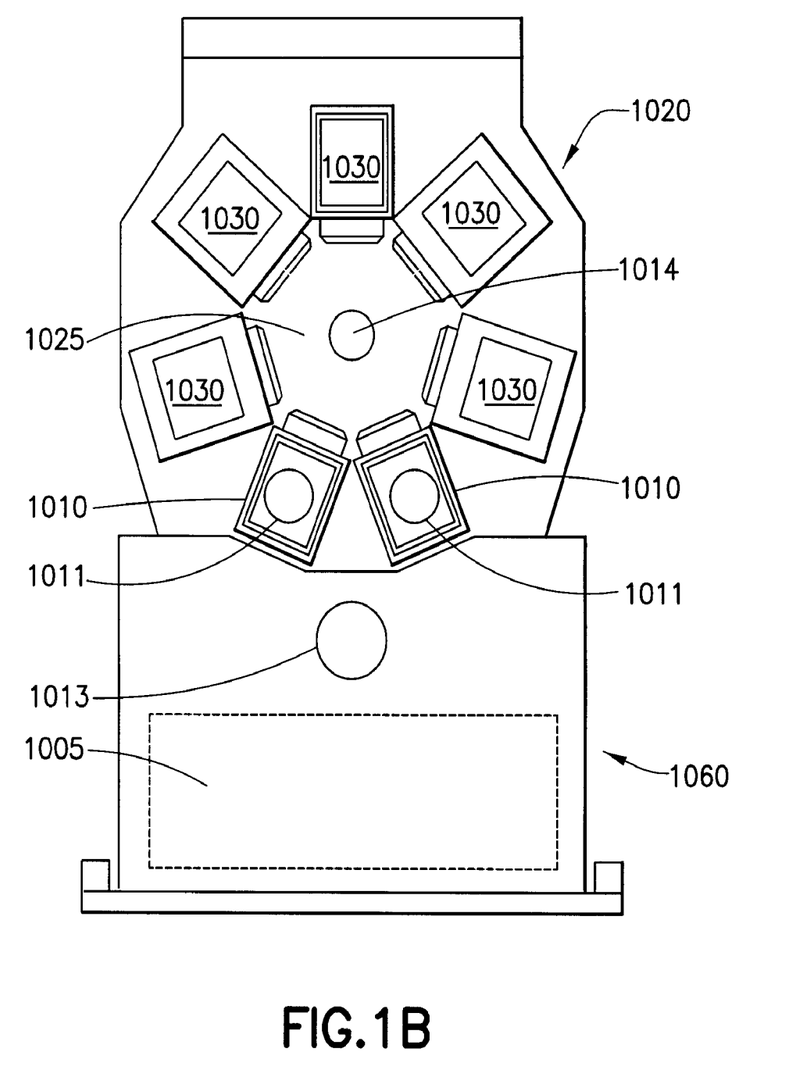

Referring to FIGS. 1A and 1B, a processing apparatus, such as for example a semiconductor tool station 1090 is shown in accordance with an aspect of the disclosed embodiment. Although a semiconductor tool is shown in the drawings, the aspects of the disclosed embodiment described herein can be applied to any tool station or application employing robotic manipulators. In this example the tool 1090 is shown as a cluster tool, however the aspects of the disclosed embodiment may be applied to any suitable tool station such as, for example, a linear tool station such as that shown in FIGS. 1C and 1D and described in U.S. patent application Ser. No. 11/442,511, entitled "Linearly Distributed Semiconductor Workpiece Processing Tool," filed May 26, 2006, the disclosure of which is incorporated by reference herein in its entirety. The tool station 1090 generally includes an atmospheric front end 1000, a vacuum load lock 1010 and a vacuum back end 1020. In other aspects, the tool station may have any suitable configuration. The components of one or more of the front end 1000, load lock 1010 and back end 1020 may be connected to controller 1091 which may be part of any suitable control architecture such as, for example, a clustered architecture control. The control system may be a closed loop controller having a master controller, cluster controllers and autonomous remote controllers such as those disclosed in U.S. patent application Ser. No. 11/178,615, entitled "Scalable Motion Control System," filed Jul. 11, 2005, the disclosure of which is incorporated by reference herein in its entirety. In other aspects, any suitable controller and/or control system may be utilized.

In the aspects of the disclosed embodiment, the front end 1000 generally includes a mini-environment 1060 such as for example an equipment front end module (EFEM) or load station that includes one or more substrate cassette holding areas 1005 as will be described in greater detail below. The one or more substrate holding areas may be configured to hold cassettes for 100 mm, 150 mm, 200 mm or 450 mm diameter wafers (generally referred to herein as substrates) or any other suitable substrates having any suitable shapes (e.g. round, square, rectangular, etc.) such as for example larger or smaller wafers or flat panels for flat panel displays, light emitting diodes (LEDs), organic light emitting diodes (OLEDs), liquid crystal displays (LCDs) or solar arrays. The EFEM or load station 1060 of the disclosed embodiment may be sized for any desired number of load stations (e.g. load ports) and is configured to provide a selectable load station capacity (e.g. the number and/or size of substrate cassettes that are held in the load station 1060 is selectable). The load station 1060 and the one or more substrate cassette holding areas may be configured to receive substrate cassettes from an overhead transport system, automatic guided vehicles, person guided vehicles, rail guided vehicles or from any other suitable transport method such as by, for example, manually loading the cassettes into the one or more substrate cassette holding areas 1005. The mini-environment 1060 generally includes any suitable transfer robot 1013 as will be described in greater detail below. The mini-environment 1060 may provide a controlled, clean zone for substrate transfer between multiple load port modules.

The vacuum load lock 1010 may be located between and connected to the mini-environment 1060 and the back end

1020. The load lock 1010 generally includes atmospheric and vacuum slot valves. The slot valves may provide the environmental isolation employed to evacuate the load lock after loading a substrate from the atmospheric front end and to maintain the vacuum in the transfer chamber when venting the lock with an inert gas such as nitrogen. The load lock 1010 may also include an aligner 1011 for aligning a fiducial of the substrate to a desired position for processing. In other aspects, the vacuum load lock may be located in any suitable location of the processing apparatus and have any suitable configuration.

The vacuum back end 1020 generally includes a transfer chamber 1025, one or more processing station(s) 1030 and a transfer robot 1014. The transfer robot 1014 will be described below and may be located within the transfer chamber 1025 to transport substrates between the load lock 1010 and the various processing stations 1030. The processing stations 1030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), metal organic chemical vapor deposition (MOCVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 1030 are connected to the transfer chamber 1025 to allow substrates to be passed from the transfer chamber 1025 to the processing stations 1030 and vice versa.

Figure 1C:
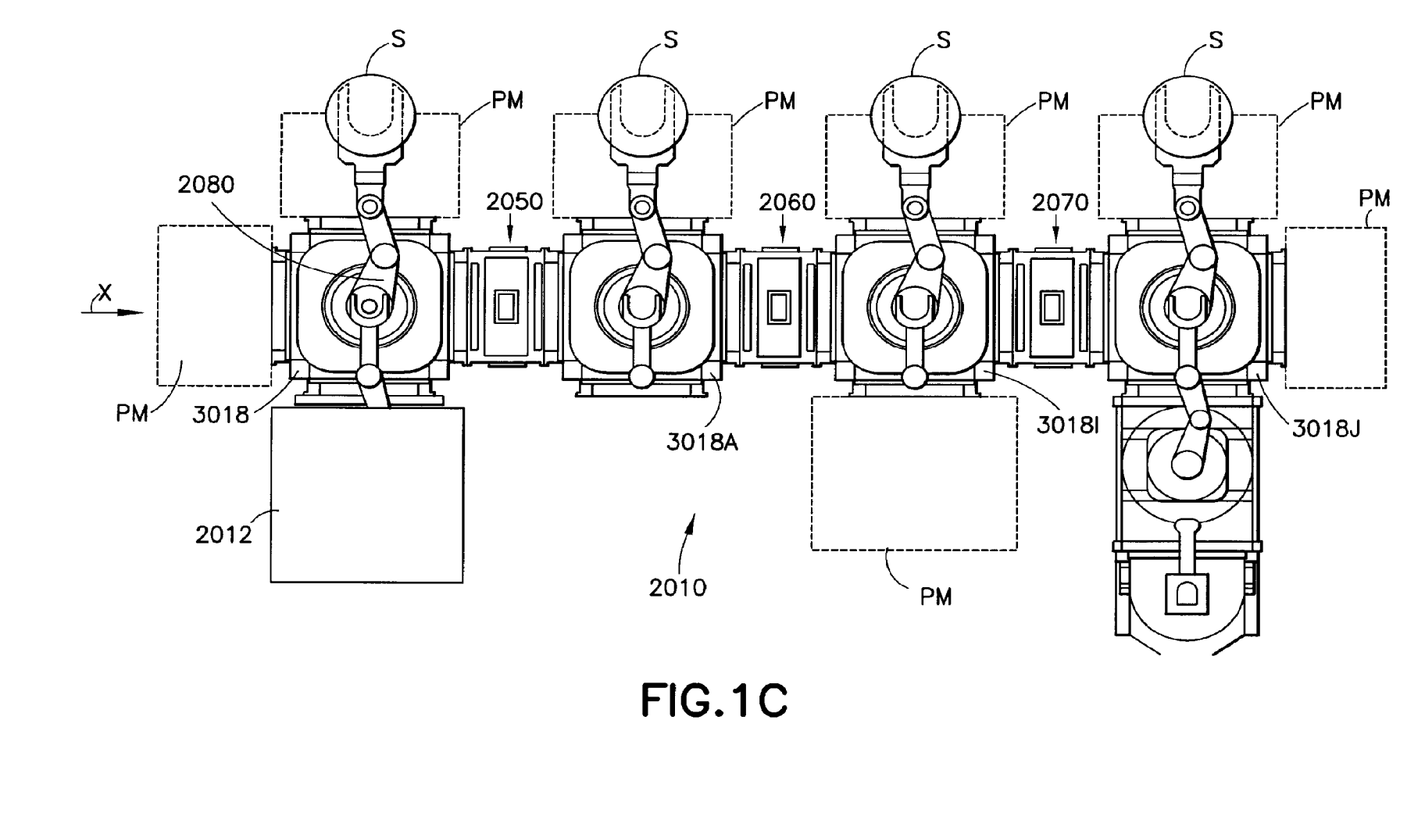

Referring now to FIG. 1C, a schematic plan view of a linear substrate processing system 2010 is shown where the tool interface section 2012 (which may be substantially similar to load station 1060 described above) is mounted to a transfer chamber module 3018 so that the interface section 2012 is facing generally towards (e.g. inwards) but is offset from the longitudinal axis X of the transfer chamber 3018, for exemplary purposes only. In other aspects the tool interface section 2012 may be substantially aligned with the longitudinal axis X of the transfer chamber 3018. The transfer chamber module 3018 may be extended in any suitable direction by attaching other transfer chamber modules 3018A, 3018I, 3018J to interfaces 2050, 2060, 2070 as described in U.S. patent application Ser. No. 11/442,511, previously incorporated herein by reference. Each transfer chamber module 3018, 3019A, 30181, 3018J includes a substrate transport 2080 as will be described in greater detail below for transporting substrates throughout the processing system 2010 and into and out of, for example, processing modules PM. As may be realized, each chamber module may be capable of holding an isolated or controlled atmosphere (e.g. N2, clean air, vacuum).

Figure 1D:
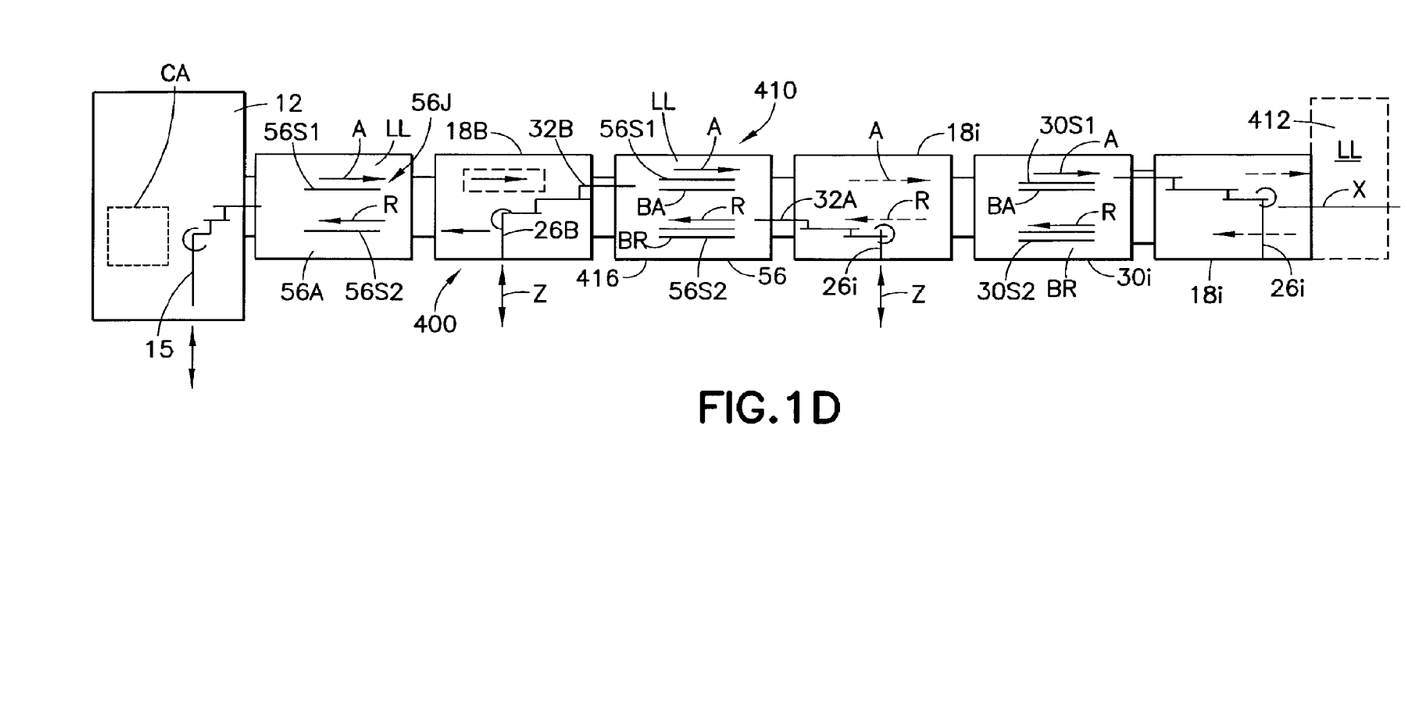

Referring to FIG. 1D, there is shown a schematic elevation view of an exemplary processing tool 410 such as may be taken along longitudinal axis X of the linear transfer chamber 416. In one aspect, as shown in FIG. 1D, the tool interface section 12 (which may be substantially similar to load station 1060) may be representatively connected to the transfer chamber 416. In this aspect, interface section 12 may define one end of the tool transfer chamber 416. As seen in FIG. 1D, the transfer chamber 416 may have another workpiece entry/exit station 412 for example at an opposite end from interface station 12. In one aspect, the workpiece entry/exit station 412 may also be substantially similar to EFEM 1060 described above. In other aspects, other entry/exit stations for inserting/removing work pieces from the transfer chamber may be provided such as between the ends of the tool transfer chamber 416. In one aspect of the disclosed embodiment, interface section 12 and entry/exit station 412 may allow loading and unloading of workpieces from the tool. In other aspects, workpieces may be loaded into the tool from one end and removed from the other end. In one aspect, the transfer chamber 416 may have one or more transfer chamber module(s) 18B, 18i. Each chamber module may be capable of holding an isolated or controlled atmosphere (e.g. N2, clean air, vacuum). As noted before, the configuration/arrangement of the transfer chamber modules 18B, 18i, load lock modules 56A, 56B and workpiece stations forming the transfer chamber 416 shown in FIG. 1D is merely exemplary, and in other aspects the transfer chamber may have more or fewer modules disposed in any desired modular arrangement. In one aspect station 412 may be a load lock. In other aspects, a load lock module may be located between the end entry/exit stations (similar to station 412) or the adjoining transfer chamber module (similar to module 18i) may be configured to operate as a load lock. As also noted before, transfer chamber modules 18B, 18i have one or more corresponding transport apparatus 26B, 26i located therein. The transport apparatus 26B, 26i of the respective transfer chamber modules 18B, 18i may cooperate to provide the linearly distributed workpiece transport system 420 in the transfer chamber. In one aspect, the transport apparatus 26B may have a general SCARA arm configuration as will be further defined herein (though in alternate embodiments the transport arms may have any other desired arrangement) while in other aspects the transport apparatus may have any suitable arm configuration such as a bisymmetric configuration, leap-frog configuration, linear sliding configuration, etc. As shown in FIG. 1D, in one aspect the arms of the transport apparatus 26B may be arranged to provide what may be referred to as fast swap arrangement allowing the transport to quickly swap wafers from a pick/place location as will also be described in further detail below. The transport arm 26B may have a suitable drive section for providing each arm with three (3) degrees of freedom (e.g. independent rotation about shoulder and elbow joints with Z axis motion) from a simplified drive system compared to conventional drive systems. In other aspects, the drive section may provide the arm with more or less than three degrees of freedom. As seen in FIG. 1D, in one aspect the modules 56A, 56, 30i may be located interstitially between transfer chamber modules 18B, 18i and may define suitable processing modules, load lock(s), buffer station(s), metrology station(s) or any other desired station(s). For example the interstitial modules, such as load locks 56A, 56 and workpiece station 30i, may each have stationary workpiece supports/shelves 56S, 56S1, 56S2, 30S1, 30S2 that may cooperate with the transport arms to effect transport or workpieces through the length of the transfer chamber along linear axis X of the transfer chamber. By way of example, workpiece(s) may be loaded into the transfer chamber 416 by interface section 12. The workpiece(s) may be positioned on the support(s) of load lock module 56A with the transport arm of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transfer chamber and may be loaded to and unloaded from any desired module (processing or otherwise) communicating with the transfer chamber. In other aspects, interstitial transfer chamber modules with static workpiece supports or shelves may not be provided between transfer chamber modules 18B, 18i. In such aspects of the disclosed embodiment, transport arms of adjoining transfer chamber modules may pass off workpieces directly (or through the use of a buffer station) from end effector or one transport arm to end effector of another transport arm to move the workpiece through the transfer chamber. The processing station modules may operate on the substrates through various deposition, etching, or other types of processes to form electrical circuitry or other desired structure on the substrates. The processing station modules are connected to the transfer chamber modules to allow substrates to be passed from the transfer chamber to the processing stations and vice versa. A suitable example of a processing tool with similar general features to the processing apparatus depicted in FIG. 1D is described in U.S. patent application Ser. No. 11/442,511, previously incorporated by reference in its entirety.

Referring now to FIGS. 2, 3, 4A, 4B and 5 the load station 1060 will be described in greater detail. In one aspect the load station 1060 may include a frame 200 suitably sized so that the load station has dimensions that are substantially similar to or comply with dimensions for an EFEM as specified in the Semiconductor Equipment and Materials International (SEMI) standards for, for example, a two-wide or two-bay EFEM (e.g. an EFEM having two side by side load ports suitable examples of which include the JET™ Atmospheric Transport System (which has a length of about 1259 mm, a depth of about 765 mm and a height of about 1865 mm) and the FabExpress™ Atmospheric System both from Brooks Automation, Inc. Another suitable example of a two-wide EFEM includes the MiniMax™ Equipment Front End Module from Genmark Automation, Inc. which has a length of about 1143 mm (45 inches), a depth of about 851 mm (33.5 inches) and a height of about 1832 mm (72.12 inches)). In other aspects, the load station 1060 may include a frame having any suitable dimensions in accordance with, SEMI standards for a four-wide EFEM (e.g. an EFEM having four side by side load ports) or any other suitable SEMI standards pertaining to load port dimensions capable of holding any suitable number of substrate cassettes. In still other aspects the load station 1060 may have any suitable dimensions. The frame 200 may have a back side 200B that is configured to sealingly couple with the vacuum load lock 1010 in any suitable manner, such as that described above and may form an environment suitable for the operation of the transfer robot 1013. In one aspect, the frame 200 may form a chamber having a controlled internal environment or any other suitable "clean room" environment. Here the frame 200 forms a substantially polygonal shape but in other aspects the frame may form any suitable shape. The sides 200S of the frame may extend from the back side 200B at any suitable angle such as, for example, substantially perpendicular to the back side 200B. The front 200F of the frame may include an angled wall where the angled wall is divided into, for example two portions 200F1, 200F2. In other aspects the front wall 200F may be a substantially straight wall that is substantially parallel with a wall of the back side 200B. The front wall 200F may include one or more openings or apertures 201 (e.g. loading/unloading apertures) that are configured to allow substrate cassettes to be inserted or removed from the frame 200 for automated or manual placement of the substrate cassettes onto a shelf 400 (FIGS. 4B and 5) of the loading station 1060. The one or more apertures 201 may each include a respective door 202 that may be hinged to the frame 200 in any suitable manner such that when the doors are open substrate cassettes can pass through the respective aperture 201 and when the door is closed the aperture 201 is substantially sealed so that the controlled environment within the frame is maintained.

As noted above, transfer robot 1013 may be located within the loading station 1060 and connected to the frame 200 in any suitable manner. The transfer robot 1013 is shown in the figures as having a three-link selective compliant articulated robot arm (SCARA) configuration (e.g. including an upper arm, a forearm and an end effector or substrate holder). It should be understood that in other aspects the transfer robot 1013 may have any suitable configuration such as, for example, a four-link SCARA arm, a bi-symmetric arm, a frog-leg/scissor type arm or a linear sliding arm. It is also noted that while the transfer robot 1013 is shown as having a single arm 1013A in other aspects the transfer robot may have more than one arm to allow for, for example, a fast swapping of substrates (e.g. one arm picks a substrate while the other arm places a substrate either substantially simultaneously or in rapid succession). As may be realized the transfer robot may include any suitable drive system having any suitable number of degrees of freedom for operating the arm. The drive system may be located at least partly within a base 1013B of the transport robot 1013 and the arm 1013A may be rotatably mounted to the base 1013B. The base 1013B may be connected to the frame 200 so as to be stationary within the X-Y plane, however, in one aspect the transfer robot 1013 may include a Z-axis drive motor so that the arm 1013A can be raised or lowered in the Z-direction (e.g. in a direction substantially perpendicular to an axis of extension and retraction of the arm 1013A). In other aspects the transfer robot may not include a Z-axis drive such that any vertical or Z-axis motion needed for transferring substrates to and from the cassettes is provided through movement of the cassettes along the Z-axis.

Figures 2A, 2B, 2C:
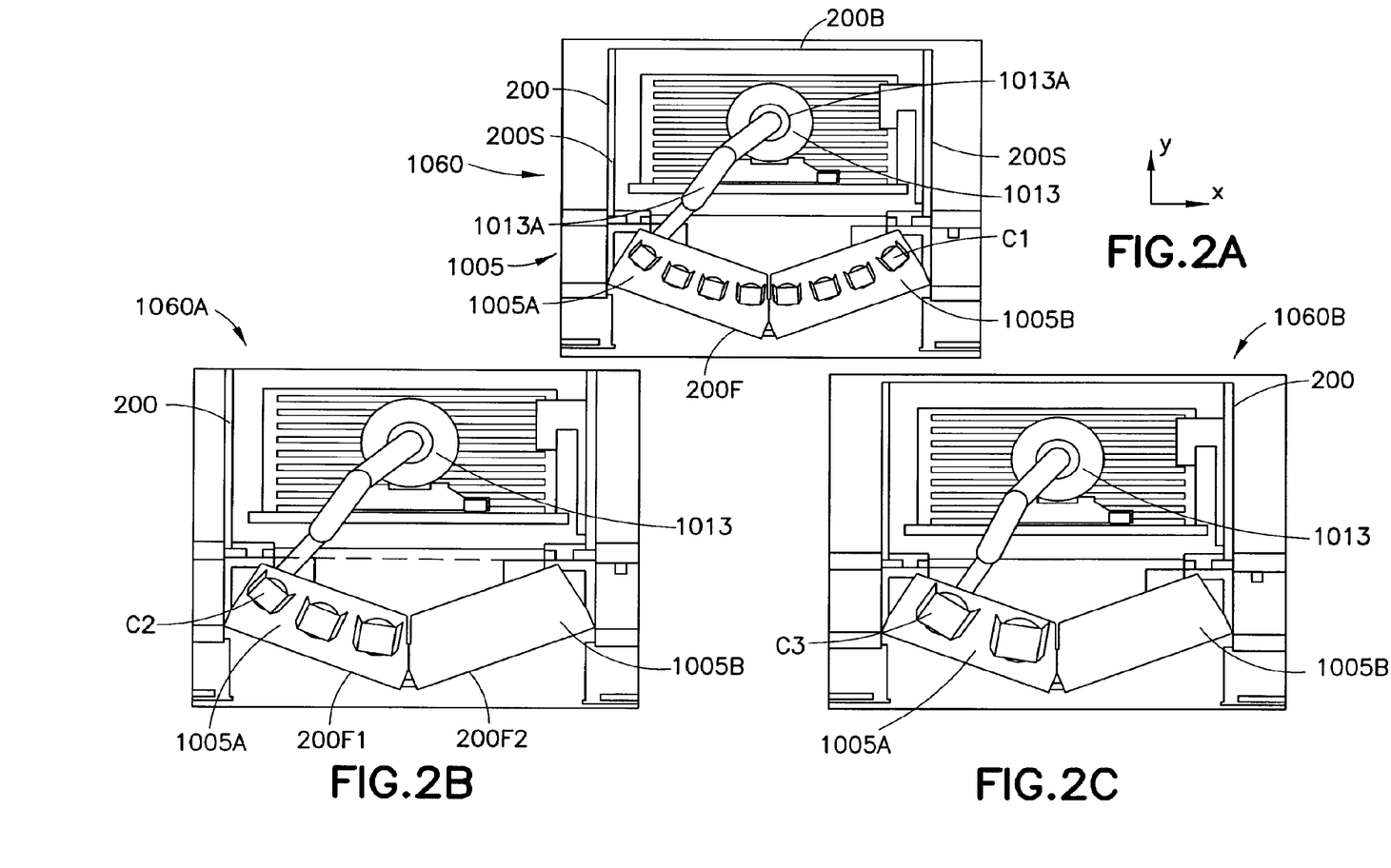
FIGS. 2A-2C are schematic illustrations of a portion of a loading station in accordance with aspects of the disclosed embodiment.
Figure 3:
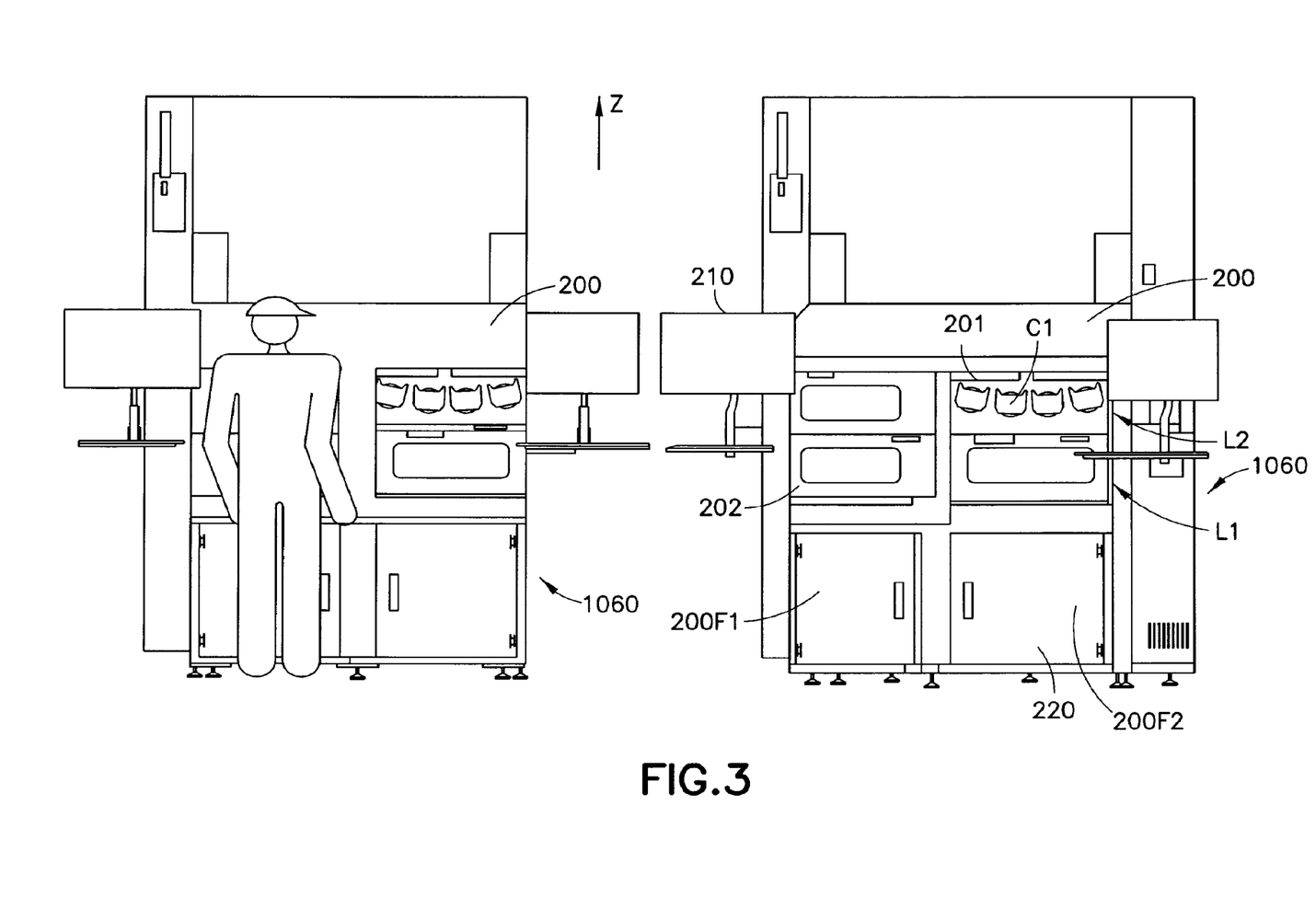
FIG. 3 is a schematic illustration of a loading station in accordance with an aspect of the disclosed embodiment.
Figure 4A:
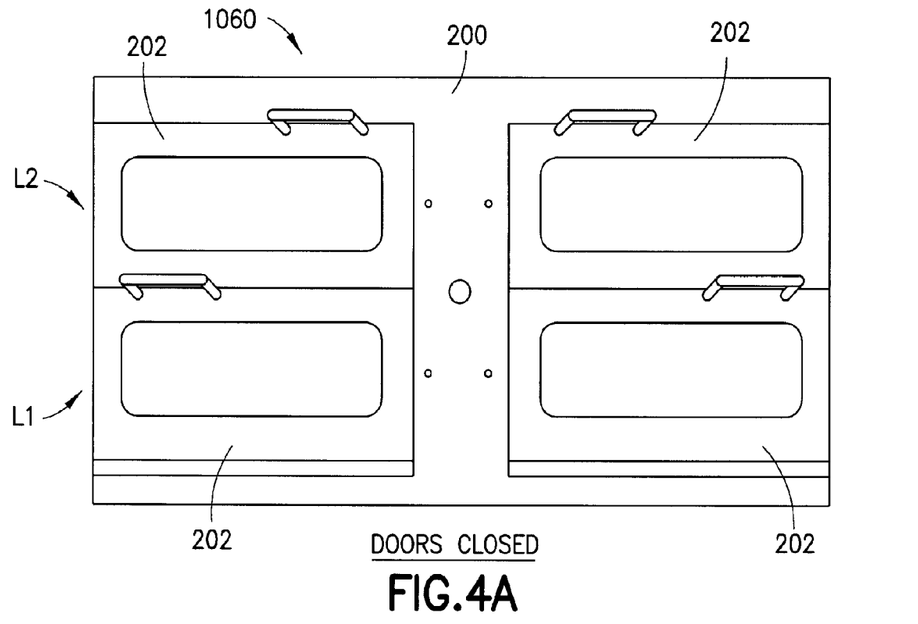
FIGS. 4A-4D are schematic illustrations of portions of a loading station in accordance with aspects of the disclosed embodiment.
Figures 4B, 4C, 4D:
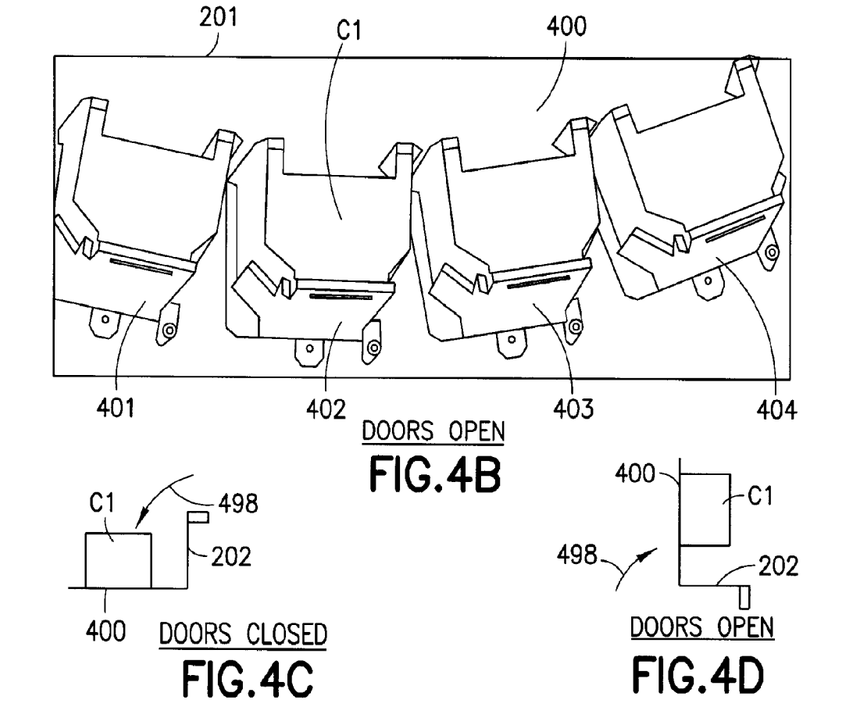
Figure 5:
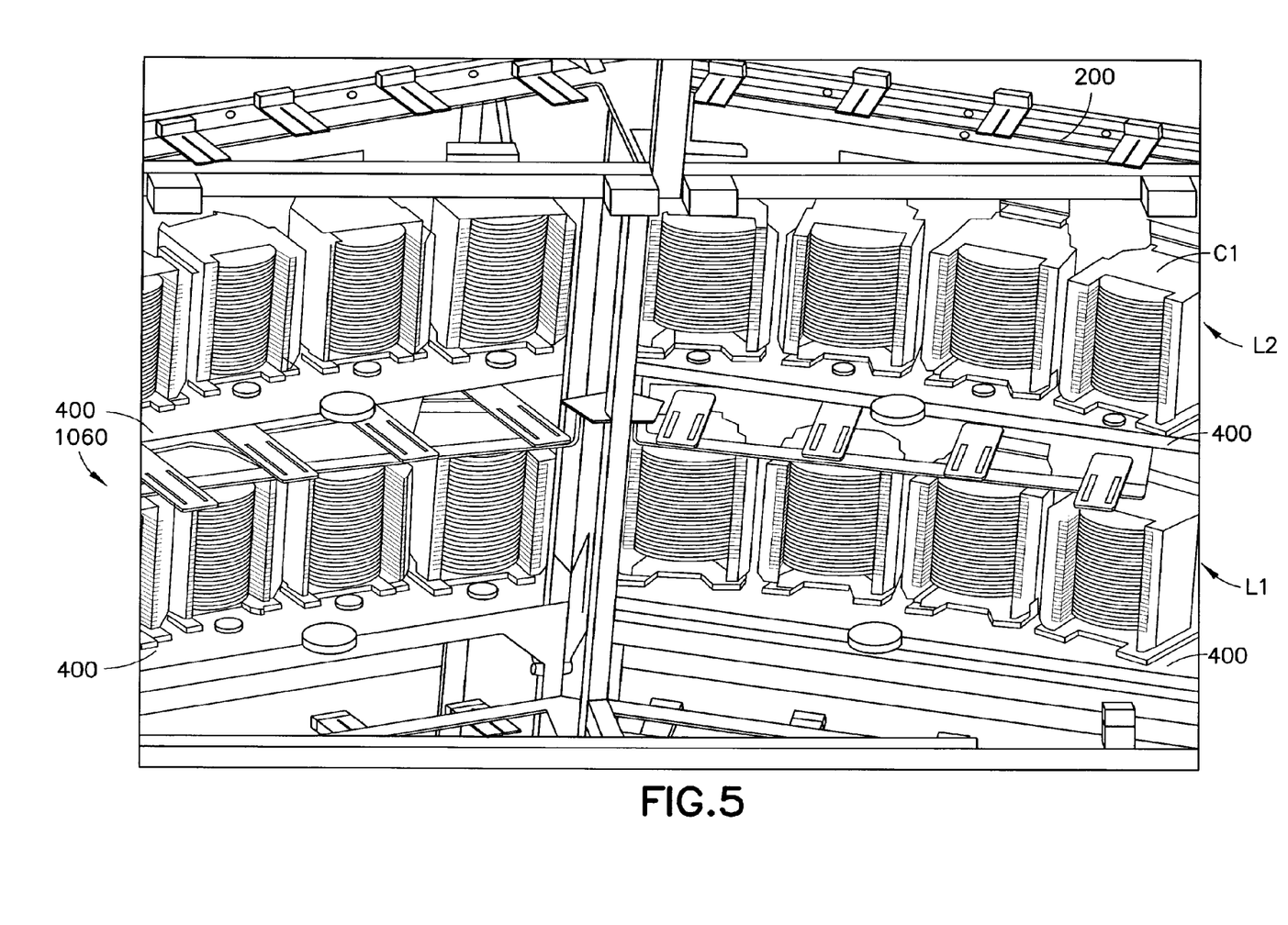
FIG. 5 is a schematic illustration of a portion of a loading station in accordance with an aspect of the disclosed embodiment.

The cassette holding area 1005 may be disposed within the frame and configured to support any suitable number of substrate cassettes. In one aspect the cassette holding area 1005 may be configured to follow, for example, the contour of the front wall 200F of the frame 200 (or the front wall 200F may be configured to follow an arrangement of the cassette holding area 1005) such as shown in FIGS. 2A-2C. In other aspects the substrate holding area may have any suitable arrangement for holding substrate cassettes and allowing the robot 1013 to access the substrate cassettes. In one aspect, the substrate cassette holding area 1005 may be arranged so that the substrate cassettes are arranged radially from a center of rotation of the transfer robot 1013 in one or more vertically stacked rows L1, L2. For example, each of the vertically stacked rows L1, L2 of the substrate holding area 1005 may include a first substrate cassette holding portion 1005A and a second substrate cassette holding portion 1005B that are angled relative to each other to allow for the radial placement of the substrate cassettes at the substrate holding area 1005. As may be realized, while the first and second substrate cassette holding portions 1005A, 1005B are shown as being separate in other aspects the portions 1005A, 1005B may form a single support having any suitable configuration.

Each of the substrate cassette holding areas 1005A, 1005B of each level L1, L2 may include a respective shelf 400 or other suitable structure configured to support one or more substrate cassettes. In one aspect each of the shelves 400 may be coupled in any suitable manner to, for example, a respective door 202 so that as the door 202 is opened the shelf 400 pivots in the direction of arrow 499 to a substrate cassette loading position (see FIG. 4D) and when the door 202 is closed the shelf 400 pivots in the direction of arrow 498 so that the door 202 seals the aperture 201 and the one or more cassettes on the shelf 400 are placed in a position that allows the transfer robot 1013 access to the substrates located within the one or more substrate cassettes. While it is noted the door 202 and shelf 400 are shown as having a substantial ninety degree positional relationship in FIGS. 4C and 4D in other aspects the doors 202 and their respective shelves 400 may have any suitable angular relationship relative to one another. It is noted that in other aspects of the disclosed embodiment the shelf 400 may not be coupled to the respective door 202 or may be coupled to the door 202 through any suitable mechanism so that the door 202 and the shelf 400 swing through different arcs (e.g. rotate different angular degrees so that the as the opens the shelf rotates a lesser amount than the door or vice versa) so that the shelf 400 can be placed in any suitable orientation for loading and unloading substrate cassettes from the shelf 400.

Referring still to FIGS. 2A-2C and 4B each shelf may be configured to interchangeably support different sized substrate cassettes C1, C2, C3. For exemplary purposes only, substrate cassette C1 may be configured to hold 100 mm diameter substrates, substrate cassette C2 may be configured to hold 150 mm diameter substrates and substrate cassette C3 may be configured to hold 200 mm substrates. It should be understood that in other aspects each shelf may be configured to support substrates cassettes configured to hold substrates of any suitable size and/or shape. Again, for exemplary purposes only with respect to substrate cassettes C1 each shelf 400 may be configured to hold about four substrate cassettes C1 so that each level L1, L2 of the load station 1060 holds about eight substrate cassettes C1 for a total of about sixteen substrate cassettes. As may be realized there may be more or less than two substrate cassette holding levels L1, L2 such that more or less than about sixteen substrate cassettes C1 are disposed within the load station 1060 and positioned to allow the transfer robot 1013 access to each of the substrate cassettes C1. Still for exemplary purposes only with respect to substrate cassettes C2 each shelf 400 may be configured to hold about three substrate cassettes C2 so that each level L1, L2 of the load station 1060 holds about six substrate cassettes C2 for a total of about twelve substrate cassettes. As may be realized there may be more or less than two substrate cassette holding levels L1, L2 such that more or less than about twelve substrate cassettes C2 are disposed within the load station 1060 and positioned to allow the transfer robot 1013 access to each of the substrate cassettes C1. Yet again for exemplary purposes only with respect to substrate cassettes C3 each shelf 400 may be configured to hold about two substrate cassettes C3 so that each level L1, L2 of the load station 1060 holds about four substrate cassettes C3 for a total of about eight substrate cassettes. As may be realized there may be more or less than two substrate cassette holding levels L1, L2 such that more or less than about eight substrate cassettes C3 are disposed within the load station 1060 and positioned to allow the transfer robot 1013 access to each of the substrate cassettes C3. As may be realized the loading station 1060 may be configured to hold any suitable number of substrate cassettes each being capable of holding any suitably sized substrate in accordance with the aspects of the disclosed embodiment.

In one aspect each of the shelves 400 may be configured to support the substrate cassettes such that the cassettes are all supported on a substantially planar surface (e.g. the cassettes are all located in the same plane). In other aspects the shelves 400 may be configured to support the substrate cassettes so that at least one cassette is supported in a first plane and at least another cassette is supported in a second plane vertically offset from the first plane by a predetermined amount. This vertical offset in substrate cassette support surfaces may correspond to the vertical offset between substrate holders where the transfer robot includes at least two arms and the substrate holders are located one above the other in substantially parallel but offset substrate transfer planes. This may allow both arms of the transport robot to extend into different cassettes substantially simultaneously for picking or placing substrates. In still other aspects each shelf 400 may include one or more Z-axis drives for lifting and lowering one or more cassettes in a direction substantially perpendicular to an axis of extension and retraction of the transfer robot 1013. This may allow the robot to pick and place substrates into the cassettes substantially without any Z-motion of the transfer robot arm. In still other aspects both the transfer robot arm and the cassettes may be moved along the Z-axis for transferring substrates to and from the cassettes.

Each substrate cassette location of the shelf 400 may include a substrate cassette holder 401-404 configured to securely hold a respective substrate cassette C1-C3. The substrate cassette holders 401-404 may be modules that are removable from a respective shelf 400. Each substrate cassette holder 401-404 may be mounted to a respective shelf 400 in any suitable manner such as, for example, through any suitable releasable mechanical fastener (e.g. screws, bolts, clips, snaps, etc.). The shelf may have the releasable fasteners located in predetermined positions for each of the different size substrate cassette holders 401-404 (corresponding to the holding cassettes C1-C3) so that the same shelf 400 can be configured to interchangeably hold any of the cassettes C1-C3 without substantial modification to the shelf 400. For exemplary purposes only, to convert a shelf 400 from holding substrate cassettes C1 to hold substrate cassettes C3 the holders 401-404 for the cassettes C1 may be removed from the shelf and the holders for cassettes C3 may be installed on the same shelf for allowing the shelf to hold the cassettes C3.

In other aspects, each shelf 400 may be interchangeable where each of the interchangeable shelves is configured to hold a predetermined size substrate cassette. Each shelve may be removably coupled to the frame in any suitable manner such as, for example, through any suitable releasable mechanical fastener (e.g. screws, bolts, clips, snaps, etc.). Here, for exemplary purposes only, to convert a substrate cassette holding portion 1005A, 1005B of the substrate cassette holding area 1005 from holding substrate cassettes C1 to hold substrate cassettes C3 the entire shelf 400 for each of the substrate cassette holding portions 1005A, 1005B may be interchangeably removed and installed so that the shelves for the cassettes C1 may be removed and the shelves for cassettes C3 may be installed in the respective substrate cassette holding portion 1005A, 1005B. It is noted that the apertures 201 of the frame 200 may be suitably sized to allow for the interchangeability of the either the shelves or the holders 401-404 in any suitable manner so that either the shelves or the holder can be installed or removed through a respective aperture substantially without disassembling the any portion of the frame 200.

It is noted that the loading station 1060 of the disclosed embodiment does not include a conventional load port on which a substrate carrier (e.g. FOUP, SMIF, etc.) is placed for interfacing with the loading station. As such, the transfer robot 1013 may be placed closer to the front (e.g. closer to front wall 200F) of the loading station 1060 to allow a greater reach of the transfer robot into the cassettes C1-C3. The pan offset of the end effector of the transfer robot 1013 may be made longer and the cassettes may be able to be positioned so that they are disposed within a closer radius to the transfer robot while still being orientated or radially aligned with the center of rotation of the transfer robot 1013 so that the transfer robot 1013 can remove or insert substrates from each cassette through a substantially pure radial extension or retraction of the arm 1013A.

In a first aspect of the disclosed embodiment a substrate loading station is provided. The substrate loading station includes a frame forming a chamber configured to hold a controlled environment, a transfer robot connected to the frame and one or more substrate cassette holding locations each capable of having a substrate cassette holder disposed within the frame. Each of the one or more substrate cassette holding locations being configured to removably support a respective substrate cassette in a predetermined position for communication with the transfer robot to effect substrate transfer between a respective cassette and the transfer robot where the one or more substrate cassette holding locations are configured to effect the interchangeability of one or more substrate cassette holders with other substrate cassette holders for changing a substrate cassette holding capacity of the substrate loading station.

In accordance with the first aspect of the disclosed embodiment each of the substrate cassette holding locations is disposed within the frame and configured to hold a respective substrate cassette so that the substrate cassette radially faces a central pivot axis of the transfer robot.

In accordance with the first aspect of the disclosed embodiment, each of the one or more substrate cassette holders is configured to hold a substrate cassette having a first size substrate therein and each of the other substrate cassette holders are configured to hold substrate cassettes having a second size substrate therein wherein the first size substrate has a different size than the second size substrate.

In accordance with the first aspect of the disclosed embodiment, the substrate loading station includes one or more levels of substrate cassette holding locations. In a further aspect, the one or more levels are vertically stacked levels. In still a further aspect, the transfer robot is configured to access each of the substrate holding locations on each of the levels.

In accordance with the first aspect of the disclosed embodiment, the frame includes one or more doors corresponding to each of the substrate cassette holding locations wherein the substrate holding locations are configured to move between a loading position and a transfer robot access position depending on a position of a respective door.

In accordance with the first aspect of the disclosed embodiment, the substrate loading station is sized to fit within the spatial dimensions specified in SEMI standards for a two-wide equipment front end module.

In accordance with the first aspect of the disclosed embodiment, each substrate cassette is configured to hold at least one substrate, the at least one substrate being for at least one of light emitting diode formation, organic light emitting diode formation and liquid crystal display formation.

In accordance with a second aspect of the disclosed embodiment, a substrate processing tool includes substrate processing section and a substrate loading station communicably connected to the substrate processing section. The substrate loading station includes a frame forming a chamber, a transfer robot connected to the frame and one or more substrate cassette holding locations each capable of having a substrate cassette holder disposed within the frame. Each of the one or more substrate cassette holding locations being configured to removably support a respective substrate cassette in a predetermined position for communication with the transfer robot to effect substrate transfer between a respective cassette and the transfer robot where the one or more substrate cassette holding locations are configured to effect the interchangeability of one or more substrate cassette holders with other substrate cassette holders for changing a substrate cassette holding capacity of the substrate loading station.

In accordance with the second aspect of the disclosed embodiment, wherein each substrate cassette holder is configured to receive a substrate holding cassette from an automated material handling system.

In accordance with the second aspect of the disclosed embodiment, each of one or more substrate cassette holders is configured to hold a substrate cassette having a first size substrate therein and each of the other substrate cassette holders are configured to hold substrate cassettes having a second size substrate therein wherein the first size substrate has a different size than the second size substrate.

In accordance with the second aspect of the disclosed embodiment, the substrate loading station includes a transfer robot and each of the one or more substrate cassette holders and each of the one or more other cassette holders is disposed within the frame so as to be radially aligned with an axis of radial extension and retraction of the transfer robot.

In accordance with the second aspect of the disclosed embodiment, the substrate loading station includes one or more levels of substrate cassette holding locations. In a further aspect, the one or more levels are vertically stacked levels. In still a further aspect, the transfer robot is configured to access each of the substrate holding locations on each of the levels.

In accordance with the second aspect of the disclosed embodiment, each substrate cassette is configured to hold at least one substrate, the at least one substrate being for at least one of light emitting diode formation, organic light emitting diode formation and liquid crystal display formation.

In a third aspect of the disclosed embodiment a substrate processing apparatus is provided. The substrate processing apparatus includes a substrate loading station having a frame forming a chamber configured to hold a controlled environment, and a substrate cassette holder. The substrate cassette holder is configured for holding one or more substrate cassettes in apposition of transfer of substrates between the one or more substrate cassettes and a transfer robot of substrate processing apparatus. The substrate cassette holder defines a substrate cassette holding capacity with selectable features so that the cassette holding capacity of the substrate holding station is selectable upon selection of the selectable features.

In accordance with the third aspect of the disclosed embodiment the selectable features include one or more substrate cassette holder modules configured for removable attachment to the substrate cassette holder, at least one of the substrate cassette holder modules being configured to hold a substrate cassette having a first size substrate therein and at least one of the other substrate cassette holder modules being configured to hold substrate cassettes having a second size substrate therein wherein the first size substrate has a different size than the second size substrate.

In accordance with the third aspect of the disclosed embodiment, each substrate cassette is configured to hold at least one substrate, the at least one substrate being for at least one of light emitting diode formation, organic light emitting diode formation and liquid crystal display formation.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

The invention claimed is:

1. A substrate loading station comprising:
    a frame forming a chamber configured to hold a controlled environment;
    a transfer robot connected to the frame; and
    one or more substrate cassette holding locations disposed on the frame and each being configured so as to hold a substrate cassette holder disposed within the frame, each of the one or more substrate cassette holding locations defining an interchangeable substrate cassette interface, that is interchangeable with other different interchangeable substrate cassette interfaces disposed coincidentally with each other on the frame, each of interchangeable substrate cassette interface and the other different interchangeable substrate cassette interface being configured to removably interface with and support a different corresponding substrate cassette holder of a different predetermined size in a predetermined position for substrate cassette communication with the transfer robot, to effect substrate transfer between a respective cassette and the transfer robot, where the interchangeable substrate cassette interface and the other different interchangeable substrate cassette interfaces of the one or more substrate cassette holding locations are selectively disposed at the one or more substrate cassette holding locations to effect interchangeability of one or more substrate cassette holders of a predetermined size with other substrate cassette holders of a different predetermined size and changing a substrate cassette holding capacity of substrate cassettes simultaneously held by the substrate loading station from a first maximum number of substrate cassettes held within the frame to a different second maximum number of substrate cassettes held within the frame, the frame being common to both the first maximum number of substrate cassettes and the different second maximum number of substrate cassettes, so that the substrate cassette holding capacity of the common frame has an interchangeable first maximum number of substrate cassette holding locations and a different second maximum number of substrate cassette holding locations.

2. The substrate loading station of claim 1, wherein each of the substrate cassette holding locations is disposed within the frame and configured to hold a respective substrate cassette so that the substrate cassette radially faces a central pivot axis of the transfer robot.

3. The substrate loading station of claim 1, wherein each of the one or more substrate cassette holders is configured to hold a substrate cassette having a first size substrate therein and each of the other substrate cassette holders are configured to hold substrate cassettes having a second size substrate therein wherein the first size substrate has a different size than the second size substrate.

4. The substrate loading station of claim 1, wherein the substrate loading station includes one or more levels of substrate cassette holding locations.

5. The substrate loading station of claim 4, wherein the one or more levels are vertically stacked levels.

6. The substrate loading station of claim 4, wherein the transfer robot is configured to access each of the substrate holding locations on each of the levels.

7. The substrate loading station of claim 1, wherein the frame includes one or more doors corresponding to each of the substrate cassette holding locations wherein the substrate holding locations are configured to move between a loading position and a transfer robot access position depending on a position of a respective door.

8. The substrate loading station of claim 1, wherein the substrate loading station is sized to fit within spatial dimensions specified in SEMI standards for a two-wide equipment front end module.

9. The substrate loading station of claim 1, wherein each substrate cassette is configured to hold at least one substrate, the at least one substrate being for at least one of light emitting diode formation, organic light emitting diode formation and liquid crystal display formation.

10. A substrate processing tool comprising:
    a substrate processing section; and
    a substrate loading station communicably connected to the substrate processing section, the substrate loading station includes
    a frame forming a chamber,
    a transfer robot connected to the frame, and
    one or more substrate cassette holding locations disposed on the frame and each being configured so as to hold a substrate cassette holder disposed within the frame, each of the one or more substrate cassette holding locations defining an interchangeable substrate cassette interface, that is interchangeable with other different interchangeable substrate cassette interfaces disposed coincidentally with each other on the frame, each of interchangeable substrate cassette interface and the other different interchangeable substrate cassette interface being configured to removably interface with and support a different corresponding substrate cassette holder of a different predetermined size in a predetermined position for substrate cassette communication with the transfer robot, to effect substrate transfer between a respective cassette and the transfer robot, where the interchangeable substrate cassette interface and the other different interchangeable substrate cassette interfaces of the one or more substrate cassette holding locations are selectively disposed at the one or more substrate cassette holding locations to effect interchangeability of one or more substrate cassette holders of a predetermined size with other substrate cassette holders of a different predetermined size and changing a substrate cassette holding capacity of substrate cassettes simultaneously held by the substrate loading station from a first maximum number of substrate cassettes held within the frame to a different second maximum number of substrate cassettes held within the frame, the frame being common to both the first maximum number of substrate cassettes and the different second maximum number of substrate cassettes, so that the substrate cassette holding capacity of the common frame has an interchangeable first maximum number of substrate cassette holding locations and a different second maximum number of substrate cassette holding locations.

11. The substrate processing tool of claim 10, wherein each substrate cassette holder is configured to receive a substrate holding cassette from an automated material handling system.

12. The substrate processing tool of claim 10, wherein each of one or more substrate cassette holders is configured to hold a substrate cassette having a first size substrate therein and each of the other substrate cassette holders are configured to hold substrate cassettes having a second size substrate therein wherein the first size substrate has a different size than the second size substrate.

13. The substrate processing tool of claim 10, wherein each of the one or more substrate cassette holders and each of the one or more other cassette holders is disposed within the frame so as to be radially aligned with an axis of radial extension and retraction of the transfer robot.

14. The substrate processing tool of claim 10, wherein the substrate loading station includes one or more levels of substrate cassette holding locations.

15. The substrate processing tool of claim 14, wherein the one or more levels are vertically stacked levels.

16. The substrate processing tool of claim 14, wherein the transfer robot is configured to access each of the substrate holding locations on each of the levels.

17. The substrate processing tool of claim 10, wherein each substrate cassette is configured to hold at least one substrate, the at least one substrate being for at least one of light emitting diode formation, organic light emitting diode formation and liquid crystal display formation.

18. A substrate processing apparatus comprising:
a substrate loading station having a frame forming a chamber configured to hold a controlled environment; and
a substrate cassette holder, the substrate cassette holder having an interchangeable substrate cassette interface, that is interchangeable with other different interchangeable substrate cassette interfaces disposed coincidentally with each other on the frame, each of interchangeable substrate cassette interface and the other different interchangeable substrate cassette interface being configured for interfacing with and holding one or more different corresponding substrate cassettes, of a different predetermined size, in apposition for transfer of substrates from the one or more substrate cassettes by a substrate transfer robot where the substrate cassette holder defines a substrate cassette holding capacity with the interchangeable substrate cassette interface and the other different interchangeable substrate cassette interface that are selectively disposed at one or more substrate cassette holding locations of the substrate cassette holder so that the cassette holding capacity of the substrate holding station is interchangeably selectable upon selection of the selectable interchangeable features between a first maximum number of substrate holding locations and a second maximum number of substrate holding locations where the substrate cassette holder is common to the first maximum number of substrate holding locations and a second maximum number of substrate holding locations.

19. The substrate processing apparatus of claim 18, wherein the selectable interchangeable substrate cassette interface and the other different interchangeable substrate cassette interfaces include one or more substrate cassette holder modules configured for removable attachment to the substrate cassette holder, at least one of the substrate cassette holder modules being configured to hold a substrate cassette having a first size substrate therein and at least one other substrate cassette holder module of the one or more substrate cassette holder modules being configured to hold a substrate cassette having a second size substrate therein wherein the first size substrate has a different size than the second size substrate.

20. The substrate processing apparatus of claim 18, wherein each substrate cassette is configured to hold at least one substrate, the at least one substrate being for at least one of light emitting diode formation, organic light emitting diode formation and liquid crystal display formation.

\* \* \* \* \*